(12) United States Patent
Richter et al.

(10) Patent No.: US 8,093,488 B2
(45) Date of Patent: Jan. 10, 2012

(54) HYBRID PHOTOVOLTAIC CELL USING AMORPHOUS SILICON GERMANIUM ABSORBERS WITH WIDE BANDGAP DOPANT LAYERS AND AN UP-CONVERTER

(75) Inventors: Hans Jürgen Richter, Palo Alto, CA (US); Samuel Dacke Harkness, IV, Berkeley, CA (US)

(73) Assignee: Seagate Technology LLC, Scott Valley, CA (US)

( * ) Notice: Subject to any disclaimer, the term of this patent is extended or adjusted under 35 U.S.C. 154(b) by 513 days.

(21) Appl. No.: 12/199,855

(22) Filed: Aug. 28, 2008

(65) Prior Publication Data
US 2010/0051095 A1  Mar. 4, 2010

(51) Int. Cl.
*H01L 31/042* (2006.01)
(52) U.S. Cl. .......................................... 136/248; 136/252
(58) Field of Classification Search .................... 136/248
See application file for complete search history.

(56) References Cited

U.S. PATENT DOCUMENTS

| | | | |
|---|---|---|---|
| 4,701,572 A | 10/1987 | Sato et al. | |
| 5,104,455 A | 4/1992 | Yokota et al. | |
| 5,244,509 A * | 9/1993 | Arao et al. | 136/259 |
| 5,324,553 A * | 6/1994 | Ovshinsky et al. | 427/571 |
| 5,417,770 A * | 5/1995 | Saitoh et al. | 136/258 |
| 6,166,318 A | 12/2000 | Freeouf | |
| 6,541,788 B2 | 4/2003 | Petroff et al. | |
| 6,670,544 B2 | 12/2003 | Kibbel et al. | |
| 7,019,333 B1 | 3/2006 | Shields et al. | |
| 7,064,263 B2 | 6/2006 | Sano et al. | |
| 7,332,211 B1 | 2/2008 | Bulovic et al. | |
| 2004/0118448 A1* | 6/2004 | Scher et al. | 136/252 |
| 2005/0151131 A1* | 7/2005 | Wager et al. | 257/51 |
| 2005/0284518 A1* | 12/2005 | Yamada et al. | 136/262 |
| 2007/0170418 A1* | 7/2007 | Bowers et al. | 257/14 |
| 2008/0113186 A1 | 5/2008 | Kouvetakis et al. | |

FOREIGN PATENT DOCUMENTS

| | | |
|---|---|---|
| WO | WO9400887 A1 | 1/1994 |
| WO | WO2005096352 A2 | 10/2005 |
| WO | WO2007095386 A2 | 8/2007 |

OTHER PUBLICATIONS

Marcinkevicius and Leon, Carrier capture and relaxation in quantum dot structures with different dot densities, 2000, Microelectronic Engineering, 51-52, 79-83.*

(Continued)

*Primary Examiner* — Alexa Neckel
*Assistant Examiner* — Miriam Berdichevsky
(74) *Attorney, Agent, or Firm* — Robert P. Lenart, Esq.; Pietragallo Gordon Alfano Bosick & Raspanti, LLP

(57) ABSTRACT

A photovoltaic apparatus includes an absorber including a p-layer having a bandgap greater than about 2 eV, an n-layer having a bandgap greater than about 2 eV, and an amorphous SiGe intrinsic layer between the p-layer and the n-layer; a first electrode adjacent to a first side of the absorber; a second electrode adjacent to a second side of the absorber; and an up-converter layer positioned adjacent to the second electrode on an opposite side of the second electrode from the absorber, wherein the up-converter layer includes a plurality of quantum dots of a first material in a matrix of a second material.

19 Claims, 1 Drawing Sheet

OTHER PUBLICATIONS

P. Bhattacharya, R. R. Das and R. S. Katiyar, Fabrication of stable wide bandgap ZnO/MgO multilayer thin films, Sep. 9, 2003, Applied Phys. Lett. 83, 10, 2010-2013.*

U.S. Appl. No. 12/195,596, filed Aug. 21, 2008, Richter et al.

U.S. Appl. No. 12/199,855, filed Aug. 28, 2008, Richter et al.

W. Shockley et al., "Detailed Balance Limit of Efficiency of p-n Junction Solar Cells", J. Appl. Physics, vol. 32, No. 3, Mar. 1961, pp. 510-519.

A. H. Mahan et al., "Influence of microstructure on the photoconductivity of glow discharge deposited amorphous SiC:H and amorphous SiGe:H alloys", Appl. Phys. Lett., vol. 50, No. 6, Feb. 9, 1987, pp. 335-337.

J. Merten et al., "Improved Equivalent Circuit and Analytical Model for Amorphous Silicon Solar Cells and Modules", IEEE Transactions on Electron Devices, vol. 45, No. 2, Feb. 1998, pp. 423-429.

X. Deng et al., "Amorphous silicon and silicon germanium materials for high-efficiency triple-junction solar cells", Solar Energy Materials & Solar Cells, vol. 62, (2000), pp. 89-95.

M. M. De Lima Jr. et al., "Boron Doping of Hydrogenated Amorphous Silicon Prepared by rf-co-Sputtering", Brazilian Journal of Physics, vol. 32, No. 2A, Jun. 2002, pp. 379-382.

T. Trupke et al., "Improving solar cell efficiencies by up-conversion of sub-band-gap light", J. Appl. Physics, vol. 92, No. 7, Oct. 1, 2002, pp. 4117-4122.

P. Wurfel, "Photon up-conversion in the presence of non-radiative recombination", J. Appl. Phys., vol. 92, (2002), 2 pgs.

J. Yang et al., "Amorphous silicon based photovoltaics—from earth to the "final frontier"", Solar Energy Materials & Solar Cells, vol. 78 (2003), pp. 597-612.

C. B. Honsberg et al., "Paths to Ultra-High Efficiency (>50% Efficient) Photovoltaic Devices", 20th European Photovoltaic Solar Energy Conference, Jun. 6-10, 2005, Barcelona, Spain, pp. 453-456.

Y. Bao et al., "Electrical and Thermal Conductivity of Ge/Si Quantum Dot Superlattices", Journal of the Electrochemical Society, vol. 152, No. 6, (2005), pp. G432-G435.

S. Y. Myong et al., "Natural hydrogen treatment effect during formation of double amorphous silicon-carbide p layer structures producing high-efficiency pin-type amorphous silicon solar cells", Applied Physics Letters, vol. 86, (2005), pp. 033506-1-033506-3.

C. Strumpel et al., "Modifying the solar spectrum to enhance silicon solar cell efficiency—An overview of available materials", Solar Energy Materials & Solar Cells, (2006), pp. 1-12.

P. Loper et al., "Efficient Upconversion Systems for Silicon Solar Cells", Presented at the 22nd European Photovoltaic Solar Energy Conference and Exhibition, Sep. 3-7, 2007, Milan, Italy, 6 pgs.

D. Forbes et al., "Development of a Quantum Dot, 0.6 eV InGaAs Thermophotovoltaic (TPV) Converter", NASA/CP, (2007), pp. 209-215.

S. Pillai et al., "Surface plasmon enhanced silicon solar cells", J. Appl. Phys., vol. 101, (2007), pp. 093105-1-093105-8.

C. Strumpel et al., "Enhancing Silicon Solar Cell Efficiency by Modifying the Solar Spectrum", 4 pgs. IEEE, 2006.

* cited by examiner

HYBRID PHOTOVOLTAIC CELL USING AMORPHOUS SILICON GERMANIUM ABSORBERS WITH WIDE BANDGAP DOPANT LAYERS AND AN UP-CONVERTER

BACKGROUND

Photovoltaic devices, also referred to as solar cells, convert light directly into electricity. The majority of photovoltaic devices use a semiconductor as an absorber layer with a well-defined bandgap, such as crystalline silicon with an energy bandgap $E_g$ of 1.1 eV. Photovoltaic devices include layers of semiconductor materials with different electronic properties. One of the layers of silicon can be "doped" with a small quantity of boron to give it a positive (or p-type) character. Another layer can be doped with phosphorus to give it a negative (or n-type) character. The p and n regions can be adjacent to each other or separated by an intermediate layer. The interface, or junction, between these two layers contains an electric field.

When light (i.e., photons) hits the device, some of the photons are absorbed in the region of the junction, freeing electrons and holes (i.e., carriers) in the absorber. If the photons have enough energy, the carriers will be driven out by the electric field and move through the silicon and into an external circuit.

Light with energy lower than the bandgap is not absorbed and is thus lost for photoelectric conversion. Light with energy E greater than the bandgap $E_g$ is absorbed. However, the excess energy $E-E_g$ is lost due to thermalization. It is well known that this results in an optimum choice for the bandgap of the absorber material. Invoking the principle of detailed balance, the optimum bandgap of a photovoltaic device has been found to be about 1.4 eV with a limiting conversion efficiency of 33%.

In single bandgap cells, only a fraction of the energy spectrum of the incident light is used for the energy conversion. For example, only a part of the energy of incident sunlight is available for photo conversion.

Amorphous materials have been proposed for use in photovoltaic devices. Known amorphous silicon photovoltaic designs are limited in conversion efficiency owing to high recombination rates. This problem is primarily due to the presence of high numbers of defect carrier traps situated deep within the bandgap. Such traps forbid the efficient transfer, and thus separation of electric charges resulting in low carrier mobility. Two main sources of the defects include hydrogen microstructure, and incomplete dopant activation. In the case of the latter, the effect is responsible for poor transport characteristics widely seen in p-doped microcrystalline silicon. In fact, because of the general inability of sputter processing to generate microcrystallinity in thin film silicon, the dopant activation is virtually nil.

Another issue related to amorphous silicon designs is the inability to control the bandgap via alloy addition. This limits the possible capture of photons to those with energies greater than 1.8 eV. Amorphous germanium is an ideal candidate to alloy with the silicon since the bandgap is about 1.0 eV. However, although silicon and germanium are miscible, a problem arises during fabrication associated with the preferred deposition technique, chemical vapor deposition (CVD). Competitive reaction rates lead to poor optoelectronic properties with increasing germanium concentration. The industry-wide solution thus far has been to control the bandgap with partial crystallinity since the presence of crystal silicon leads to a lower bandgap, since the bandgaps are approximately 1.8 eV for amorphous silicon, and 1.1 eV for crystalline silicon. While this approach is effective, it necessitates thicker absorber regions since the increased crystalline content drastically decreases the effective absorption coefficient of the material.

SUMMARY

In one aspect, the invention provides a photovoltaic apparatus including an absorber with a p-layer having a bandgap greater than about 2 eV, an n-layer having a bandgap greater than about 2 eV, and an amorphous SiGe intrinsic layer between the p-layer and the n-layer; a first electrode adjacent to a first side of the absorber; a second electrode adjacent to a second side of the absorber; and an up-converter layer positioned adjacent to the second electrode on an opposite side of the second electrode from the absorber, wherein the up-converter layer includes a plurality of quantum dots of a first material in a matrix of a second material.

DETAILED DESCRIPTION OF THE INVENTION

In a first aspect, this invention provides an apparatus or device that utilizes a combination of wide bandgap semiconductor materials and amorphous absorber materials that are placed on an up-converting layer including quantum dots.

Figure 1:
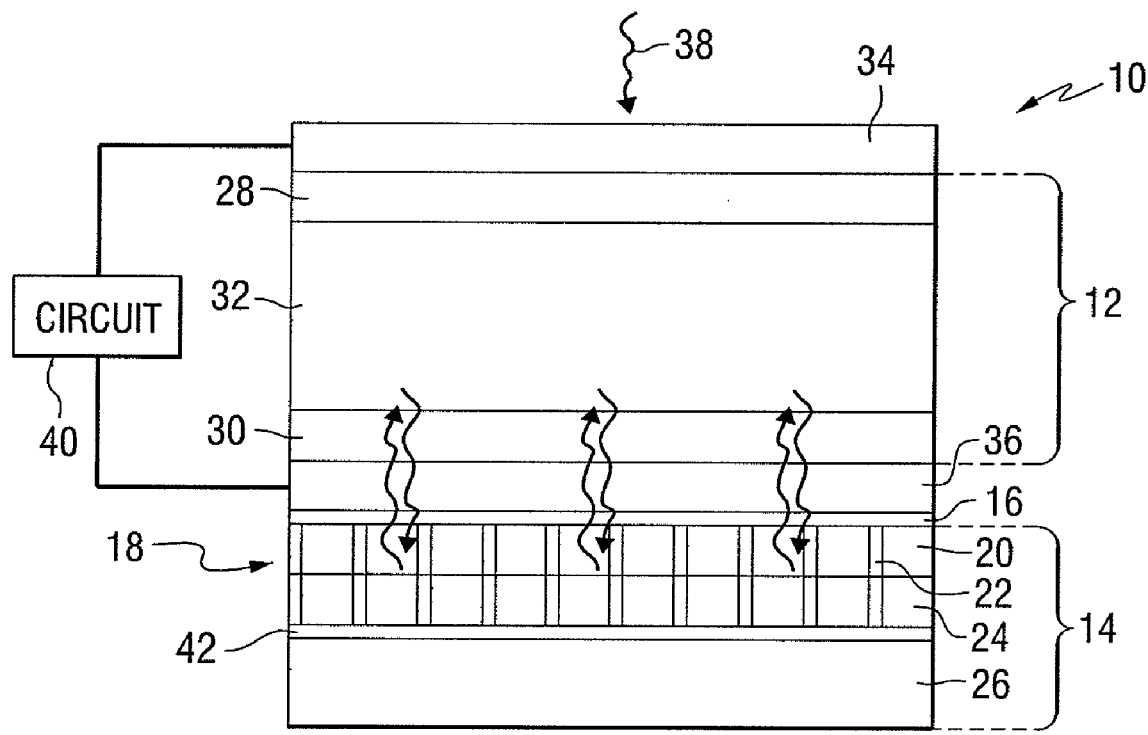
FIG. 1 is a schematic representation of a photovoltaic device constructed in accordance with an aspect of the invention.

FIG. 1 is a schematic representation of a photovoltaic device 10 including an absorber 12, and an up-converter 14, with an insulating layer 16 between the up-converter and the absorber.

The up-converter layer includes a quantum dot layer 18, which includes a plurality of quantum dots 20 of a semiconductive material. The quantum dots are separated by a wide bandgap semiconductor material or an insulating material 22, such as for example $TiO_2$ or $SiO_2$. The quantum dots can be formed on a seedlayer 24, which is supported by a substrate 26, which can be an amorphous metal. The substrate can also serve as a reflector. Underneath the seedlayer is an amorphous layer 42, which is continuous. While in principle the amorphous layer could be the substrate, in practice the amorphous layer 42 is deposited in a separate step.

The absorber includes a p-doped region 28, also called a p-layer, and an n-doped region 30, also called an n-layer. These regions can be formed in a material such as silicon. An intermediate layer 32, also called an intrinsic layer, is positioned between the p and n regions. The absorber in this example forms a p-i-n diode structure. The interface, or junction, between the p and n regions contains an electric field. A transparent conductive oxide (TCO) electrode 34 is formed on top of the absorber. Another electrode TCO 36 is positioned on the opposite side of the p-i-n stack. When light 38 (i.e., photons) hits the device, some of the photons are absorbed in the region of the junction, freeing electrons in the absorber. If the photons have enough energy, the carriers will be driven out by the electric field and move through the absorber and the doped regions and then into an external circuit 40. Photons that pass through the absorber can be up-converted in the up-converter, and directed back into the absorber. In this example, the TCO electrodes serve as means for connecting the device to an external circuit.

FIG. 1 shows an example for an up-converting cell with a transparent contact layer, including a quantum dot layer that is electrically isolated from the absorber. There are various ways to construct a solar cell with an up-converter including a quantum dot layer. In the example of FIG. 1, the up-converter is electrically separated from the cell itself. In this case, the back contact (i.e., electrode 36) is transparent and located above the up-conversion layer. In one example, the substrate can be, for example, glass.

Photovoltaic devices constructed in accordance with one aspect of the invention include an $Si_xGe_{(1-x)}$ alloy in the intrinsic layer. The composition (i.e., the ratio of Si to Ge) is selected by tuning the value of 'x' to achieve a desired bandgap in the absorber material. A preferred bandgap range is between about 1.0 and about 1.4 eV.

To reduce the effect of defects and to promote high optoelectronic quality, the intrinsic layer material can be prepared using either dc-magnetron, or rf-magnetron sputtering. The target used in the sputter process can be an alloy target having a stoichiometric ratio of silicon to germanium similar to that desired in the finished film. To further reduce the defect level, the target should have a purity level of 99.999% or greater.

Preferred process conditions during growth of the absorber layer include: low substrate temperature (e.g., <300° C.); low sputter gas pressure (e.g., Ar <10 mTorr) in a partial hydrogen environment sufficient in volume ratio to filly reduce the dangling bond density; and relatively low deposition rate (e.g., <10 nm/s). The hydrogen content can be adjusted by using a mixture of argon and hydrogen as sputter gas rather than argon. The optical bandgap increases when hydrogen is incorporated in the film. One way to measure the necessary amount of hydrogen is, therefore, to determine the hydrogen pressure that is needed to saturate the optical bandgap. Among others, a suitable technique to measure the bandgap is by ellipsometry.

The materials selection and processing can be controlled to optimize the intrinsic layer to the desired bandgap while not compromising the absorption coefficient. In a SiGe alloy intrinsic layer, as germanium content is increased in the alloy, the absorption becomes stronger. The absorption can be set to allow full extinction of the incoming solar radiation within an intrinsic absorber having a thickness of about 500 nm. This compares to an intrinsic absorber thickness of about 3600 nm for conventional amorphous silicon designs.

In a single absorber example, the composition of the absorber can be varied such that the high bandgap material (Si rich) is closer to the illuminated side and the low bandgap material (Ge rich) is further away from the illuminated side.

Another aspect of the invention involves the use of wide bandgap semiconductor materials to generate the built-in potential of the device. As used herein, a wide bandgap is a bandgap having an energy of greater than about 2 eV. This can be accomplished by doping select materials to form the n-doped and p-doped layers and positioning the doped layers on opposite sides of the absorber.

A preferred material for the n-layer is ZnO-2 wt % $Al_2O_3$. The carrier concentration and mobility can be adjusted by changing the amount of aluminum activated onto the ZnO lattice. Dopant activation energies less than 0.5 eV are readily achieved along with preferred room temperature electron concentrations of greater than $1 \times 10^{20}$.

A preferred material for the p-layer is ZnO-2 wt % $P_2O_5$. Post thermal treatment of greater than 800° C. for 1 minute or longer may be required to render the material p-type with the desired hole carrier concentration (e.g., greater than $1 \times 10^{18}$). The ZnO doped layers can further include MgO to form an $Zn_xMg_{1-x}O$ alloy.

Since the quantum dot layer is electrically disconnected from the main solar cell, the function of the matrix material is to separate the dots. $TiO_2$ and $SiO_2$ are good examples for matrix materials, as they are known to form good separations between the dots. The same material, e.g., $TiO_2$ and $SiO_2$, can be used for the insulator layer between the quantum dot layer and the active solar cell. The insulation layer thickness should be greater than 2 nm, with a typical range of about 5 nm to about 10 nm.

The transparent electrodes can be comprised of, for example, zinc oxide (ZnO), Al doped ZnO, indium tin oxide (ITO), $SnO_2$, or fluorinated $SnO_2$ with preferred thicknesses between about 50 nm and about 200 nm.

The up-conversion layer can be formed as a two-dimensional sheet film structure that includes a matrix containing co-planar precipitates of quantum dot (QD) semiconductors. This configuration yields a very high coverage of the surface with quantum dots enabling high optical absorption. In the example of FIG. 1, the optical and the electrical portions of the device are decoupled.

In cells having an up-converter, a part of the light energy with $E > E_g$ that enters the structure is absorbed in the usual way. The low energy portion of the light (i.e., where $E < E_g$) goes through the absorber with essentially no attenuation. In the up-converter, the photons are absorbed in two or more steps. After excitation, the electron-hole pairs recombine radiatively in one step, whereby they emit light of correspondingly higher energy. This emitted light is directed back to the absorber. In a properly designed system, the energy of the emitted light is greater than the absorber bandgap, and the solar cell absorber has an opportunity to absorb energy of the lower energy part of the spectrum.

In the absorber, the doped layers that provide the built-in voltage are conductive and transparent. An example for suitable materials for the p and the n-doped layer is ZnO, but other transparent oxides may be used as well. As shown in FIG. 1, the electrodes are connected to the ZnO and so the electric current does not have to pass through the quantum dot layer, thus enabling a decoupling of the optical up-conversion layer and the electrical portion of the cell.

With a functional up-converting layer, the cell design described above does not show the highest efficiency at a bandgap of 1.1 to 1.4 eV. The optimum bandgap is shifted towards higher values and Si rich absorber alloys are preferred.

In one aspect, this invention provides a photovoltaic device that uses a quantum dot layer as a means for up-converting light. The quantum dot layer can be located underneath the absorber layer. Low energy light that passes through the absorber layer is up-converted and emitted back to the absorber by the quantum dot layer, thus enhancing the conversion efficiency of the device.

In another example, the position of the p and the n-layers in FIG. 1 can be reversed.

Figure 2:
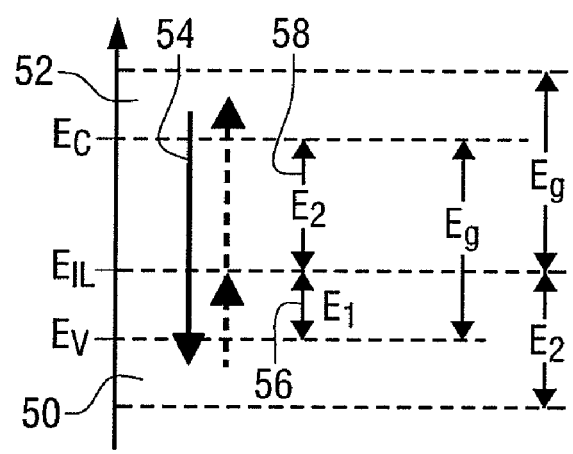
FIG. 2 is a schematic representation of the energy levels in the device of FIG. 1.

FIG. 2 is a schematic representation of energy levels in the device of FIG. 1. $E_g$ is the energy gap between the valence band 50 and the conduction band 52 for the absorber material. $E_V$ represents the energy level at the top of the valence band, $E_C$ represents the energy level at the bottom of the conduction band, and $E_{IL}$ represents an intermediate energy level. The low energy portion of the light (i.e., where $E < E_g$) goes through the absorber with essentially no attenuation. In the up-converter, the photons are absorbed in two or more steps. In this example, $E_1$ is the difference in energy between $E_V$ and $E_{IL}$, and $E_2$ is the difference in energy between $E_{IL}$ and $E_C$. After excitation, the electron-hole pairs recombine radiatively in one step as illustrated by arrow 54, whereby they emit light of correspondingly higher energy $E_{emit}=E_1+E_2$, as illustrated by arrows 56 and 58. This emitted light is directed back to the absorber, either directly or by being reflected by the reflector.

The utilization of quantum dots as an up-converter has the advantage that quantum dots provide a strong absorption and allow an easy way to control the energy levels, such as by changing the dot size. The quantum dots can be grown on suitable templates, which may be metallic in nature, that exhibit the ability to induce crystallographic texture in the semiconductor layer above. An example of a template that can be used to grow the quantum dots is described in a commonly owned U.S. patent application Ser. No. 12/195,482, and titled "Thin Film Template For Fabrication Of Two-Dimensional Quantum Dot Structures", which is hereby incorporated by reference.

The up-conversion layer can be in the form of a two-dimensional sheet film structure that includes a matrix containing co-planar precipitates of quantum dot (QD) semiconductors. This configuration yields a very high coverage of the seedlayer surface with quantum dots enabling high optical absorption. Examples of the fabrication of the quantum dot layer are described below.

The semiconductor material that is used to form the quantum dots can be co-deposited with a second material, for example a wide bandgap semiconductor material or insulating material, such that the quantum dots nucleate as a precipitate in a matrix material. The volume fraction of the quantum dot material can be between about 40% and about 90%. The quantum dot material can be, for example, PbS, PbSe, InAs, InP, InN, InSb, CdS, CdSe, CdTe, $B_2S_3$, $Bi_2S_3$, AlSb, or $Si_xGe_{1-x}$. The matrix material can be, for example, $TiO_2$, $SiO_2$, ZnS, $Ta_2O_5$, $Zn_2P_3$, or $Nb_2O_5$.

The quantum dots and matrix materials can be fabricated using a sputter deposition technique. The quantum dot layer can be fabricated in a process environment that is similar to the region of a Thornton Diagram known as Zone 1. Process conditions typical to the Thornton Diagram Zone 1 are low to moderate substrate temperatures (e.g., <40% homologous temperature), and relatively high sputter gas pressures (e.g., >20 mTorr).

In one example, the substrate temperature is <200° C. and the gas pressure is >30 mTorr Ar. This process configuration yields thin films with columnar grain structures with varying amounts of porosity between neighboring quantum dots, also referred to as grains. Generally, the quantum dot and matrix materials should have surface energies between 2-3 $J/m^2$. Most materials with lower surface energy will tend to wet the surface and most materials with higher surface energy will tend toward being amorphous.

Such a process facilitates the segregation of immiscible materials, forming a columnar grain structure of quantum dots, while the immiscible matrix material is collected, or trapped, at the porous grain boundary regions, where it forms a connective matrix with low volume fraction. The quantum dot layer may resemble a honeycomb when viewed in plan view, where the matrix forms the honeycomb lattice and the quantum dots occupy the holes. Examples of suitable matrix materials, also referred to as segregates, include $TiO_2$, $SiO_2$, ZnS, $Ta_2O_5$, or $Nb_2O_5$.

Depending on the electrical characteristics of the sputter targets used in the deposition process, rf-magnetron or rf-diode cathodes may be used for the deposition. When using PbS for the dot material and $TiO_2$ for the matrix material, commercially available dc-magnetrons may be used. Dc-magnetrons offer flexibility in terms of processing pressure and may therefore be more desirable to use in a manufacturing setting. It may also be necessary to include the addition of gases such as $O_2$ or $H_2S$ or others during the co-deposition, so as to properly adjust the constituent stoichiometries of the semiconductor and the segregant. Such a co-deposition process leads to isolated semiconductor grain particles that have dimensions consistent with quantum confinement (e.g., about 2 nm to about 10 nm).

A log-normal distribution of grain diameters, d, can be expected. With optimization, it is possible to achieve $\sigma_d/d$ less than 20%, where $\sigma_d$ is the standard deviation of the grain sizes. In one example, the quantum dot layer thickness can range from about 2 nm to about 20 nm. In another example, the quantum dot layer thickness can range from about 2 nm to about 10 nm.

Suitable materials for the quantum dots include low bandgap materials, such as PbS, PbSe, InP, CdSe, CdS, InAs, InSb, Ge and so forth. The choice of the matrix material is discussed further below.

Some design rules for selecting the materials are as follows:

1. A particle can be considered a quantum dot, if the following relation holds $$\Delta x \approx \sqrt{3}\,\pi \sqrt{\frac{\hbar^2}{mk_BT}}$$

where
$\hbar$=Planck's constant (i.e., approximately $6.626\times10^{-34}$ joule-seconds),
m=the effective electron mass,
$k_BT$=thermal energy,
$k_B$=1.38 $10^{-34}$ J/K, and
T=temperature in Kelvin,
that is, the particle diameter should be equal or less than $\Delta x$. The energy levels in these quantum dots are given by:

$$E = \frac{\pi^2\hbar^2}{2m}\left(\frac{n_x^2}{d_x^2} + \frac{n_y^2}{d_y^2} + \frac{n_z^2}{d_z^2}\right)$$

where $d_x$, $d_y$, and $d_z$ are the dimensions of the dot in the respective directions and $n_x$, $n_y$, and $n_z$ are integers (1,2, 3, . . . ) and specify the quantization levels. It is therefore clear that a simple control of the size of the dots creates the necessary energy levels needed for an up-conversion process.

2. Materials that are best suited for up-converters are those in which electrons are allowed to relax after one of the intermediate steps, if this relaxation is combined with a change in selection rules for radiative transitions involving the relaxed state and the unrelaxed state, respectively. As stated above, an up-conversion is more likely to occur if there is a two-step process in which the selection rules change.

3. Ideally, the indices of refraction (i.e., the indices of the composite quantum dot and matrix layer) of the absorber and the up-converter should be matched.

As an example, consider a device in which amorphous Si is used as the absorber material. From published data, PbS, PbSe, InAs and Ge are good quantum dot material candidates for fulfilling the requirement that the bandgap is rather small and that the index of refraction in the region of interest (long wavelength) match that of amorphous Si reasonably well.

The quantum dot layer can be grown on a structure having several layers. Suitable growth layers have two or more individual layers where the top layer or seedlayer is used to create the granular structure on which the quantum dots are grown. The seedlayer may include elements such as Al, Au, Ag, Pt, Pd, Cu, Ni, Rh, Ru, Co, Re, Os, Cr, Mo, V, Ta, V and multi-component alloys of the same elements. The seedlayer can be grown on amorphous metallic layers such as FeCoB or CrTa or other such amorphous metals/alloys. The seedlayer and the amorphous metallic layer can form a reflector that is used to reflect photons back to the absorber. Typical dot sizes are between about 5 nm and about 12 nm, with a thickness ranging from about 10 nm to about 50 nm. The separation thickness of the dots is typically about 1 nm to about 3 nm.

The examples described above can be combined with light trapping measures. Light trapping measures include controlled texturing of the bottom reflector to increase the number of paths which the light can make through the absorber, and the up-conversion layer in this case, or controlled roughening of the top surface. Alternatively, plasmon layers can be used to enable multiple passes of the light through the absorber. Additionally, anti-reflection coatings can be applied to the layers.

While the invention has been described in terms of several examples, it will be apparent to those skilled in the art that various changes can be made to the disclosed examples, without departing from the scope of the invention as set forth in the following claims. The implementations described above and other implementations are within the scope of the following claims.

What is claimed is:

1. A photovoltaic apparatus comprising:
    an absorber including a p-layer having a bandgap greater than about 2 eV, an n-layer having a bandgap greater than about 2 eV, and an amorphous SiGe intrinsic layer between the p-layer and the n-layer;
    a first electrode adjacent to a first side of the absorber;
    a second electrode adjacent to a second side of the absorber; and
    an up-converter layer positioned adjacent to the second electrode on an opposite side of the second electrode from the absorber, wherein the up-converter layer includes a plurality of quantum dots of a first material in a matrix of a second material, wherein the first material has a lower bandgap than the intrinsic layer, and the second material comprises a semiconductive material or an insulator.

2. The photovoltaic apparatus of claim 1, wherein the ratio of Si to Ge in the intrinsic layer is selected to obtain a bandgap between about 1.1 and about 1.4 eV.

3. The photovoltaic apparatus of claim 1, wherein the p-layer comprises ZnO, and the n-layer comprises ZnO.

4. The photovoltaic apparatus of claim 3, wherein the p-layer further comprises MgO and the n-layer further comprises MgO to form an $Zn_xMg_{1-x}O$ alloy.

5. The photovoltaic apparatus of claim 1, wherein the p-layer has a thickness of about 10000 Å, the n-layer has a thickness of about 3000 Å, and the intrinsic layer has a thickness of about 5000 Å.

6. The photovoltaic apparatus of claim 1, further comprising:
    a substrate; and
    an insulating layer between the substrate and the second electrode.

7. The photovoltaic apparatus of claim 1, wherein the volume fraction of the quantum dots of the material in the up-converter layer is between about 40% and about 90%.

8. The photovoltaic apparatus of claim 1, wherein the quantum dots form a columnar grain structure.

9. The photovoltaic apparatus of claim 1, wherein the second material comprises one or more of:
    $TiO_2$, $SiO_2$, ZnS, $Ta_2O_5$, and $Nb_2O_5$.

10. A photovoltaic apparatus comprising:
    an absorber including a p-layer having a bandgap greater than about 2 eV, an n-layer having a bandgap greater than about 2 eV, and an amorphous SiGe intrinsic layer between the p-layer and the n-layer;
    a first electrode adjacent to a first side of the absorber;
    a second electrode adjacent to a second side of the absorber; and
    an up-converter layer positioned adjacent to the second electrode on an opposite side of the second electrode from the absorber, wherein the up-converter layer includes a plurality of quantum dots of a first material in a matrix of a second material, wherein the first material comprise one or more of: PbS, PbSe, InAs, InP, InN, InSb, CdS, CdSe, CdTe, $B_2S_3$, $Bi_2S_3$, AlSb, $Zn_2P_3$, and $Si_xGe_{1-x}$.

11. The photovoltaic apparatus of claim 1, wherein the up-converter layer has a thickness of about 2 nm to about 20 nm.

12. The photovoltaic apparatus of claim 1, further comprising:
    a substrate layer; and
    a seedlayer between the substrate layer and the up-converter layer.

13. The photovoltaic apparatus of claim 12, wherein the seedlayer comprises one or more of:
    Al, Au, Ag, Pt, Pd, Cu, Ni, Rh, Ru, Co, Re, Os, Cr, Mo, V, Ta, V, and alloys thereof.

14. The photovoltaic apparatus of claim 12, wherein the substrate comprises:
    FeCoB or CrTa.

15. The photovoltaic apparatus of claim 1, wherein the quantum dots have a size in a range of between about 4 nm and about 12 nm.

16. The photovoltaic apparatus of claim 1, wherein the quantum dots have a thickness in a range of between about 10 nm and about 50 nm.

17. The photovoltaic apparatus of claim 1, wherein the quantum dots are separated from each other by a distance in a range of between about 1 nm and about 3 nm.

18. The photovoltaic apparatus of claim 1, wherein the second electrode comprises one or more of:
    Al doped ZnO, ZnO, ITO, $SnO_2$ and fluorinated $SnO_2$.

19. The photovoltaic apparatus of claim 18, wherein the second electrode has a thickness in a range of between about 50 nm and about 500 nm.

* * * * *